US008698483B2

(12) United States Patent
Riesebosch

(10) Patent No.: US 8,698,483 B2
(45) Date of Patent: Apr. 15, 2014

(54) LED LAMP DRIVER IDENTIFICATION

(75) Inventor: Scott A. Riesebosch, St. Catharines (CA)

(73) Assignee: CRC, Electronics, Inc., Welland, Ontario (CA)

( * ) Notice: Subject to any disclaimer, the term of this patent is extended or adjusted under 35 U.S.C. 154(b) by 157 days.

(21) Appl. No.: 13/292,690

(22) Filed: Nov. 9, 2011

(65) Prior Publication Data

US 2013/0113458 A1 May 9, 2013

(51) Int. Cl.

| | |
|---|---|
| ***H01J 7/44*** | (2006.01) |
| ***G05F 1/00*** | (2006.01) |
| ***G01R 29/00*** | (2006.01) |
| ***G01R 13/00*** | (2006.01) |
| ***H05B 33/08*** | (2006.01) |

(52) U.S. Cl.

CPC ................ *G01R 29/00* (2013.01); *G01R 13/00* (2013.01); *H05B 33/0815* (2013.01); *H05B 33/0803* (2013.01)

USPC ........................... 324/76.11; 315/51; 315/294

(58) Field of Classification Search

CPC .... G01R 29/00; G01R 13/00; H05B 33/0815; H05B 33/0803

USPC .................................. 324/76.11; 315/51, 294

See application file for complete search history.

(56) References Cited

U.S. PATENT DOCUMENTS

| | | | | |
|---|---|---|---|---|
| 4,712,060 | A * | 12/1987 | Bailey et al. | 324/76.77 |
| 7,358,679 | B2 * | 4/2008 | Lys et al. | 315/51 |
| 7,667,408 | B2 | 2/2010 | Melanson et al. | |
| 2009/0251068 | A1 * | 10/2009 | Holec et al. | 315/294 |
| 2009/0295292 | A1 * | 12/2009 | Harmgardt et al. | 315/51 |
| 2010/0013409 | A1 * | 1/2010 | Quek et al. | 315/294 |
| 2010/0066266 | A1 | 3/2010 | Huang et al. | |
| 2012/0278421 | A1 * | 11/2012 | Sun et al. | 709/208 |

* cited by examiner

*Primary Examiner* — Jermele M Hollington
*Assistant Examiner* — Farhana Hoque
(74) *Attorney, Agent, or Firm* — Bingham McCutchen LLP

(57) ABSTRACT

The type of an LED power driver (i.e., a magnetic transformer or an electronic transformer) is determined by manipulating the AC voltage produced by the power driver so that it may be analyzed and the type of power driver reliably determined. In various embodiments, a system for detecting an AC power supply type includes a circuit for monitoring a negative half or a positive half of an output voltage of the AC power supply and an analyzer for determining the AC power supply type based at least in part on a presence or absence of an envelope in the monitored output voltage.

20 Claims, 7 Drawing Sheets

LED LAMP DRIVER IDENTIFICATION

FIELD OF THE INVENTION

Embodiments of the present invention generally relate to light-emitting diode ("LED") systems and, more specifically, to such systems and methods that identify the type of LED power driver.

BACKGROUND

An increasing number of light fixtures utilize LEDs as light sources due to their lower energy consumption, smaller size, improved robustness, and/or longer operational lifetime relative to conventional (e.g., incandescent) light sources. An LED is a low-voltage solid state device; it cannot be directly powered by standard high-voltage AC power without controlling the applied voltage and the current flowing therethrough. For example, most LED lamps require a 12 V or 24 V supply voltage; because the LED lamps may act as replacements for traditional lighting, however, they have access only to a 120 V or 240 V source. Therefore, LED lamps usually include a voltage transformer to convert the high input voltage to a lower level usable by the LED and its support circuitry.

The transformer may be a magnetic transformer or an electronic transformer. In a magnetic transformer, there are two coils of wire: the primary coil and the secondary coil. The primary coil carries the high-voltage input and creates a magnetic flow in an iron core, which induces a current in the secondary coil that is also wrapped around the iron core. Because there are more windings in the primary coil than in the secondary, the secondary coil has a lower voltage. The exact output voltage depends on the ratio of windings in the two coils. FIG. 1A depicts an output 100 of a typical magnetic transformer that is approximately 12 V RMS AC at approximately 60 Hz. This frequency allows the LEDs to operate without causing a visible flicker in their outputs. Advantages of the magnetic transformer include the reliability of the output voltage, long lifetime, and/or tolerance of a high operating temperature. The magnetic transformer, however, is usually large, expensive, and heavy.

An electronic transformer, on the other hand, is a complex electrical circuit that produces a high-frequency (i.e., 10 kHz or greater) AC voltage having an "envelope" that approximates the low-frequency output of a magnetic transformer. FIG. 1B illustrates a high-frequency output 102 of an electronic transformer that has a voltage envelope 104 approximating 60 Hz (similar to the frequency produced by the magnetic transformer shown in FIG. 1A). Benefits of electronic transformers include their small size, light weight, and quietness of operation. The electronic transformer, however, may suffer from radio-frequency interference with other components when the transformer is placed close to noise-generating components in the lighting system due to its more complicated circuitry, and may stop working or "stall" when its output current drops too low.

Thus, magnetic and electronic transformers differ greatly in design, behavior, and challenges. A circuit designed to work with one may not work with (or not work well with) the other. A conventional method for identifying the type of the transformer is to analyze the frequency components in the waveforms of its output voltage. The presence of high-frequency components in the waveform indicates that the transformer is electronic, and the absence of high-frequency components indicates the use of a magnetic transformer. It may be difficult, however, to reliably detect the high-frequency components due to (for example) a high noise level, and designing such detection circuitry may be expensive. In addition, filter capacitors are often used to remove high frequency noise, thereby making high frequency detection more difficult. Consequently, there is a need for a circuit that more reliably (and economically) identifies the type of a source transformer.

SUMMARY

In various embodiments, the present invention relates to systems and methods for identifying the type of an LED power driver (i.e., a magnetic transformer or an electronic transformer) by manipulating the AC voltage produced by the power driver so that it may be analyzed with greater reliability. For example, some embodiments utilize a sense circuit and a voltage waveform analyzer. The sense circuit first modifies the AC voltage produced by the power driver to a form more suitable for analysis by, for example, rectifying the voltage either above or below a preset level; the analyzer then monitors and analyzes the shape of the modified output voltage. If the shape of the waveform constantly oscillates with a frequency of approximately 120 Hz, for example, the analyzer determines that the transformer is electronic; whereas if the waveform oscillates with a frequency of approximately 60 Hz (e.g., if it contains a missing voltage envelope at the 60 Hz frequency), the analyzer identifies the transformer as magnetic.

As used herein, the term "approximately" means ±10% (e.g., by amplitude), and in some embodiments, ±5%. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

Accordingly, in one aspect, the invention pertains to a system for detecting an AC power supply type. The system includes a circuit for monitoring a negative half or a positive half of an output voltage of the AC power supply and an analyzer for determining the AC power supply type based at least in part on a presence or absence of an envelope in the monitored output voltage. In various embodiments, the type of the power supply includes a magnetic-transformer power supply or an electronic-transformer power supply.

In one embodiment, the sense circuit includes a diode. The diode is a discrete component or disposed in a clamping circuit in an input of a microprocessor. In some embodiments, the diode is a Zener diode.

In another embodiment, the sense circuit further includes a device for limiting current flowing through the diode. The device may be a resistor or transistor. In various embodiments, the current-limiting device and the diode are connected in series and connect to at least one output port of the power supply.

In some embodiments, the system further includes removing the monitored negative half or positive half of the output voltage to create a modified output voltage. In one embodiment, the analyzer includes digital logic for sampling the output voltage and analyzing the samples. In another embodiment, the analyzer includes analog logic for determining an average voltage of the output voltage In various embodiments, the system includes a controller for controlling at least one system behavior, such as a current waveform, power consumption, dimmer response curve, or minimum current draw, based on the type of the AC power supply.

In a second aspect, the invention relates to a method for detecting an AC power supply type. In some embodiments, the method includes modifying the monitored output voltage. In one implementation, modifying the output voltage includes removing a negative half from the output voltage. In another implementation, modifying the output voltage includes removing a positive half from the output voltage.

In one embodiment, the presence or absence of the envelope is detected based at least in part on multiple sampling voltages at a sampling frequency. The sampling frequency may be approximately equal to frequency of an electronic transformer or approximately 60 Hz, 120 Hz, or 180 Hz.

In another embodiment, the presence or absence of the envelope is detected based at least in part on RMS voltage of the modified output signal.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which.

DETAILED DESCRIPTION

Figure 1A:
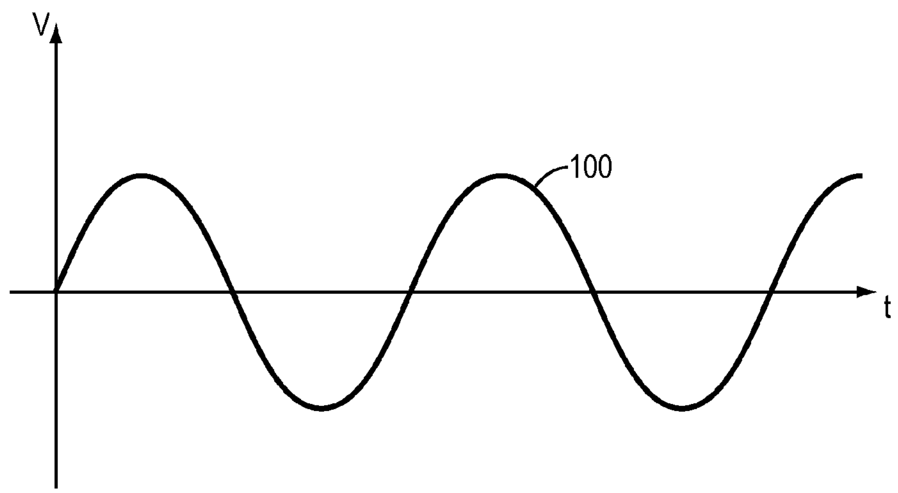
FIG. 1A is an output voltage waveform of a magnetic transformer.
Figure 1B:
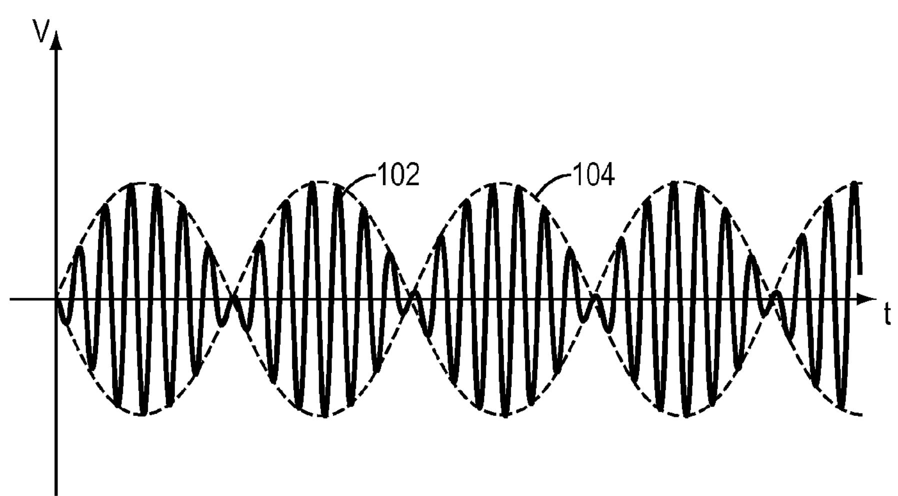
FIG. 1B is an output voltage waveform of an electronic transformer.
Figure 2:
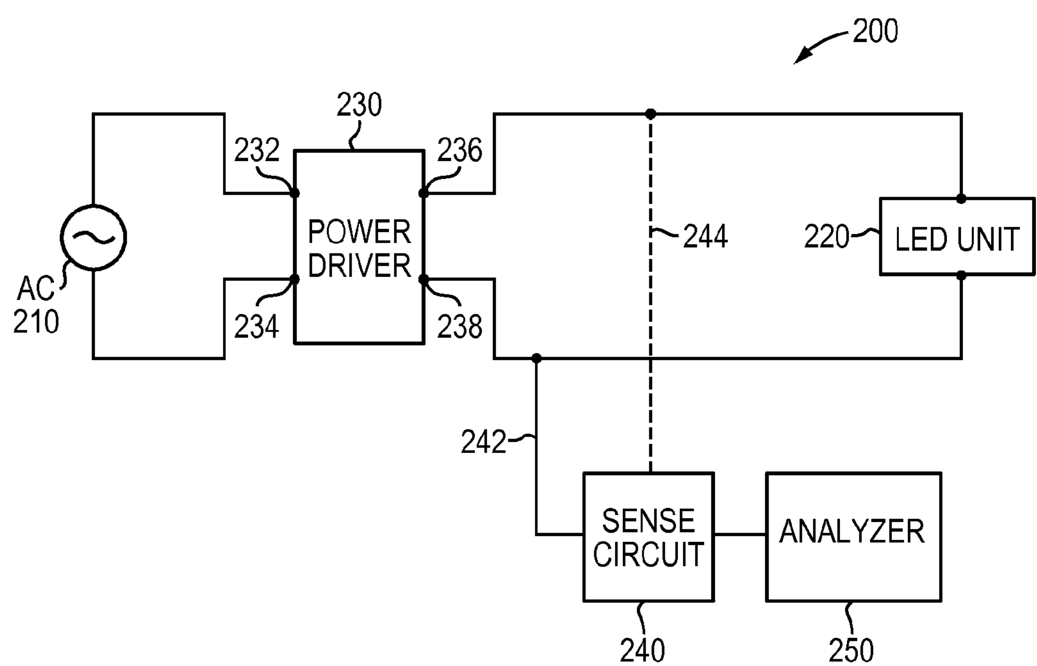
FIG. 2 schematically illustrates an LED lighting system in accordance with the present invention.

FIG. 2 illustrates an LED lighting system 200 that includes an AC input voltage 210 (e.g., an AC mains signal or wall socket) applied to an LED unit 220 via an LED power driver 230. The LED power driver may include a magnetic transformer or an electronic transformer. In various embodiments, an AC voltage of 120 V having a frequency of 60 Hz is applied to input ports 232, 234 of the power driver and be converted to a lower voltage of 12 V or 24 V at the output ports 236, 238. The lower voltage is then applied to the LED unit 220. The LED unit may include LED(s), a rectifier circuit for converting the AC voltage to a DC voltage, a driver IC, and/or LED support circuitry. The LED(s) may be conventional semiconductor LED(s), organic LED(s), or polymer LED(s). The input power of the LED(s) generally requires a DC voltage/current; therefore, a rectifier circuit such as a bridge rectifier, which contains four diodes, is usually utilized in the LED unit. In some embodiments, a sense circuit 240 is incorporated in the LED lighting system 200. The sense circuit 240 and an analyzer 250 connected thereto connects, via one or more connections 242, 244, to at least one of the output ports 236, 238 of the power driver to identify the type of the power driver. The sense circuit 240 monitors the output voltage of the power driver 230 to detect a positive or negative half pulse. In one embodiment, the sense circuit 240 converts the monitored voltage of the power driver 230 into a form more suitable for analysis; for example, the sense circuit 240 may rectify the output voltage of the power driver by removing a negative half or a positive half of the AC voltage. The modified voltage thus has only a single polarity. The analyzer 250 monitors the modified voltage and thereby determines the type of LED power driver, as further described below.

Figure 3A:
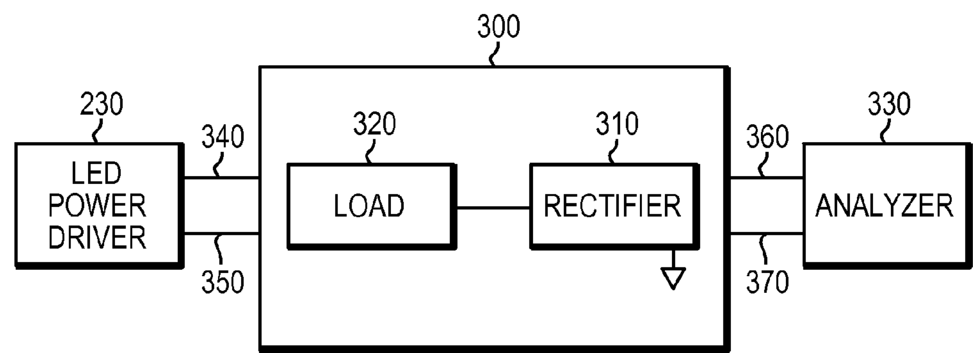
FIGS. 3A and 3B depict exemplary sense circuits connected to an analyzer and an LED power driver in accordance with the present invention.
Figure 3B:
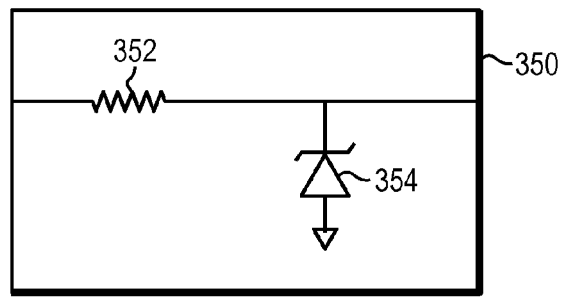

With reference to FIG. 3A, in some embodiments, the sense circuit 300 includes a rectifier 310 to transform the output voltage and a load 320 to control current flowing through the rectifier 310. The rectifier 310 may include, for example, a Zener diode, standard diode, or other MOSFET device, and allows current to flow freely in one direction but allows the current to flow in the reverse direction only when the applied voltage is above a breakdown voltage. For example, a diode with a Zener breakdown voltage of 5.1 V exhibits a voltage drop of very nearly 5.1 V across a wide range of reverse currents; the rectifier 310 thus rectifies the AC output voltage of the LED power driver. One exemplary implementation 350 of the sense circuit 300 appears in FIG. 3B and includes a resistor 352 and a Zener diode 354. In the illustrated embodiment, the load 320 is connected in series with the rectifier 310 to prevent diode failure by regulating the current flowing therethrough. The load 320 may be an active load (e.g., transistor) or a passive load (e.g., a resistor, as shown in FIG. 3B). In another embodiment, the load 320 connects to a clamping circuit (e.g., an ESD protection clamp) at an input of a microprocessor 360, as shown in FIG. 3C. The microprocessor 360 modifies the output voltage of the power driver utilizing internal clamping diodes such that the modified output voltage has values between 0V and 5V.

Figure 4A:
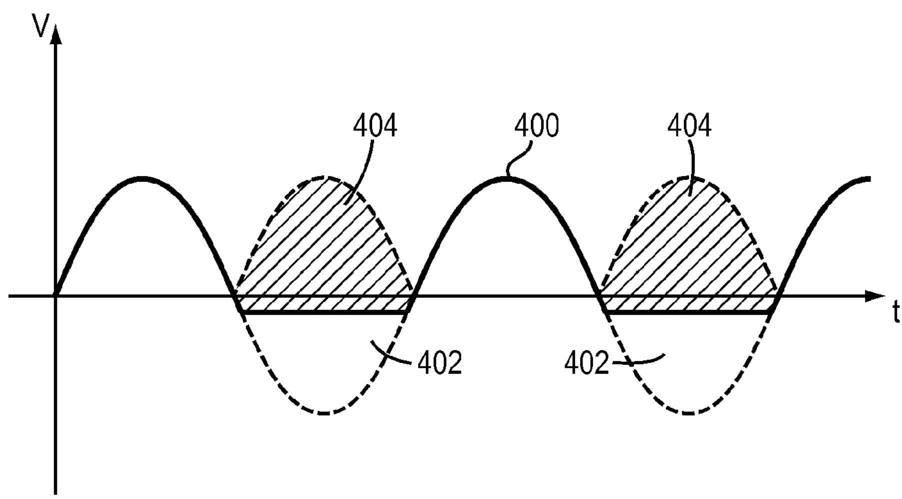
FIG. 4A depicts an output waveform of a magnetic transformer modified by the sense circuit.
Figure 4B:
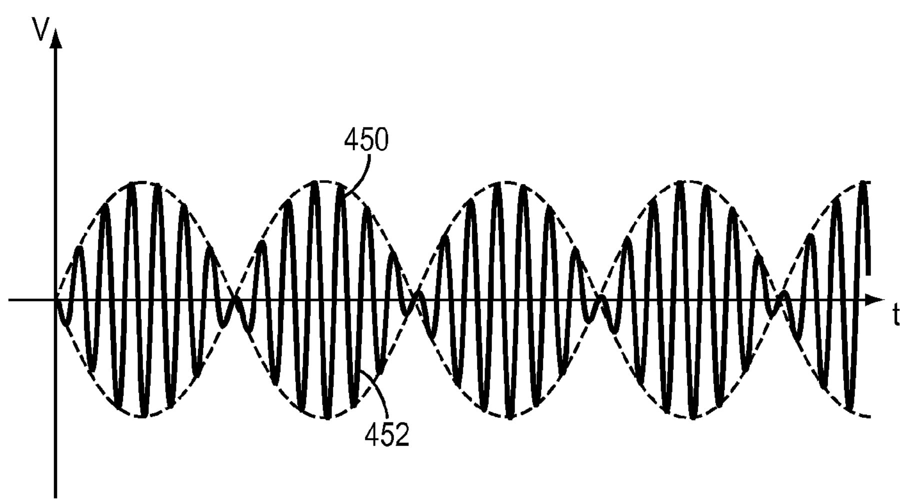
FIG. 4B depicts an output waveform of an electronic transformer modified by the sense circuit.

FIG. 4A depicts the half-wave rectification 400 of the output voltage 100 of a magnetic transformer, in which a negative half 402 (or, in other embodiments, a positive half) of the waveform voltage is removed from every other half cycle and results in a missing voltage envelope 404 in every other half cycle. FIG. 4B depicts a full-wave rectification 450 of the output voltage 102 of an electronic transformer, in which a negative half 452 (or, in other embodiments, a positive half) of the waveform voltage is removed from every half cycle. The rectifier 310, therefore, modifies the waveforms of the output voltage of the LED power driver such that the modified output voltages 400, 450 of a magnetic transformer and an electronic transformer are significantly different (i.e., the modified output voltage 400 of the magnetic transformer lacks output envelopes 404 that the modified output voltage 450 of the electronic transformer possesses). As described in detail below, the analyzer 330 detects this difference.

In various embodiments, an analyzer 330 is connected to the sense circuit 300. The analyzer 330 detects the voltage waveform modified by the sensor circuit 300 and determines the type of the LED power driver based on the presence or absence of a voltage envelope in the modified output voltage. In one embodiment, the analyzer includes digital logic; a plurality of voltage samples may be taken at a sampling frequency appropriate for the approximately 40 kHz electronic-transformer frequency (e.g., 200 kHz). The analyzer 330 determines that the power driver is a magnetic transformer if the sampled voltages indicate the absence of a non-zero voltage during every other envelope or an electronic transformer if the sampled voltages are nonzero for every envelope. In another embodiment, two or three samples per cycle (e.g., sampling frequency is approximately 60 Hz, 120 Hz, or 180 Hz) are taken by the analyzer 330; this frequency is sufficient for the analyzer to determine the type of power driver, even if some aliasing occurs, because the statistical likelihood of all the sensing samples being taken at zero voltage is very small. In some embodiments, the analyzer may include an analog circuit that, for example, measures the RMS voltage of the modified output signal. If the measured RMS voltage is approximately constant, the analyzer 330 deems the power driver to be an electronic transformer. If the measured RMS voltage, however, is variable (e.g., it oscillates between a first nonzero value (such as 12 V or 24 V) and approximately zero, the analyzer 330 deems the power driver to be a magnetic transformer.

Figure 5A:
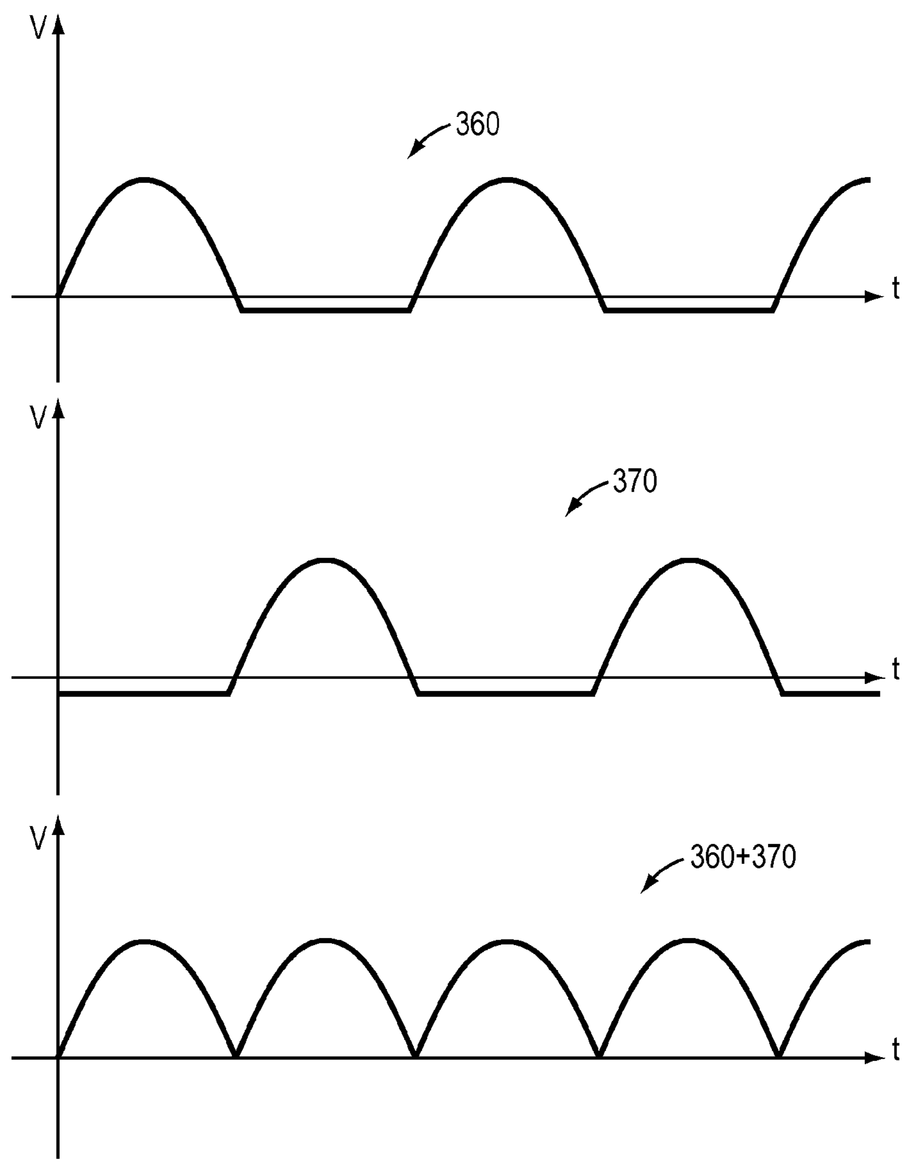
FIG. 5A illustrates a waveform of the voltage of a magnetic transformer modified by an analyzer.
Figure 5B:
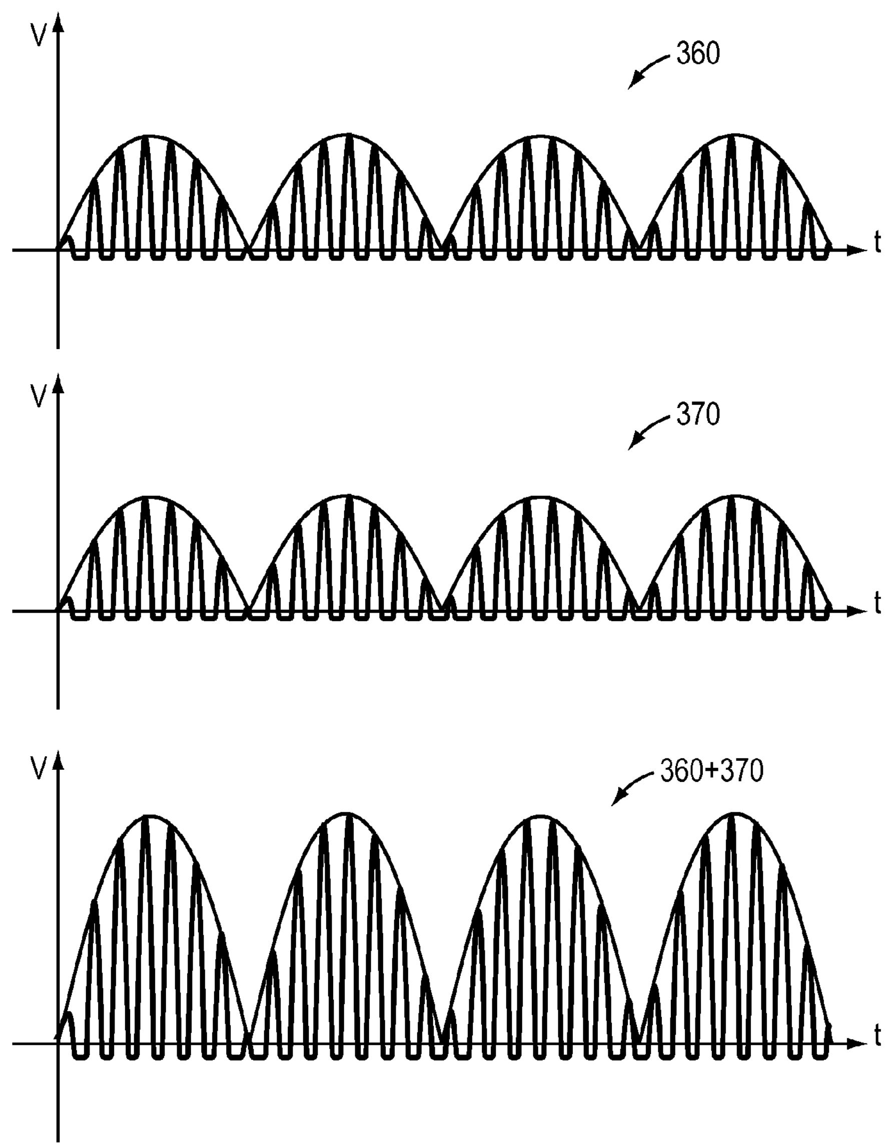
FIG. 5B illustrates a waveform of the voltage of an electronic transformer modified by an analyzer.

The sense circuit 300 and analyzer 330 may monitor both the positive 340 and negative 350 output signals of the LED power driver simultaneously. The analyzer 330 may include an additive mixer to add, for example, the modified output voltages 360 and 370, as depicted in FIGS. 5A and 5B. In one embodiment, the analyzer 330 further includes an analog circuit that detects the maximum of the added voltage. With reference to FIG. 5A, if the maximum magnitude of the added voltage is approximately the same as the output voltage 340 or 350, the power driver is likely to be a magnetic transformer. If, however, the maximum magnitude of the added voltage is approximately twice as large as the output voltage 340 or 350, as depicted in FIG. 5B, the driver transformer may be electronic. In another embodiment, the analyzer may include a mixer to subtract modified output voltages 360, 370. If the power driver is an electronic transformer, the resulting voltage is approximately zero; whereas the resulting voltage oscillates between a positive maximum and a negative maximum for a magnetic transformer.

Once the type of the transformer is detected, the analyzer may send a signal to a component in the LED lamp that may modify a behavior of the lamp, such as a current waveform, power consumption, dimmer response curve, and/or minimum current draw based on the detected type. For example, a circuit in the LED lamp that modifies a current or voltage driving the LED itself may modify the driving current or voltage in accordance with an input dimming signal differently for magnetic or electronic transformers. If the detected type is an electronic transformer, for example, the circuit may ensure that a minimum current is drawn from the electronic transformer to prevent it from stalling. In another embodiment, the LED circuit modifies the rate at which the LED dims, in response to the incoming dimming signal, to provide a consistent light-intensity response to a given user input despite the type of the transformer used. The current invention is not limited, however, to any particular application of the detected transformer type.

Figure 6:
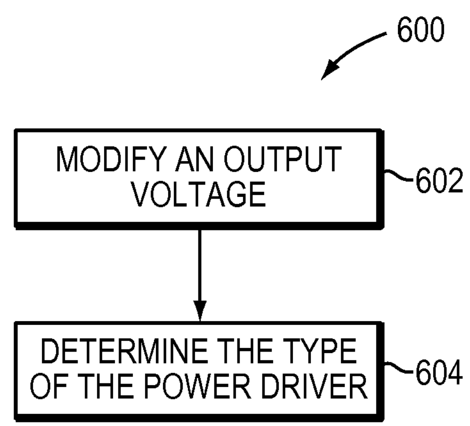
FIG. 6 is a flow chart illustrating a method in accordance with one embodiment for detecting an AC power supply type.

A method 600 for detecting a transformer type in accordance with embodiments of the current invention is shown in FIG. 6. In a first step 602, an output voltage of the power supply is modified using a sense circuit. In a second step 604, the type of the power supply is electronically determined based at least in part on a presence or absence of an envelope in the modified output voltage.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A system for detecting whether a transformer used in an AC power supply is magnetic or electronic, the system comprising:

a circuit for modifying an output voltage of the AC power supply and for monitoring a negative half or a positive half of the modified output voltage; and an analyzer for (i) determining whether half-cycles of approximately zero voltage of a signal or a signal envelope are present in either the negative half or the positive half of the monitored output voltage and (ii) determining that the AC power supply comprises a magnetic-transformer power supply if half-cycles of approximately zero voltage of a signal are present in the monitored output voltage or determining that the AC power supply comprises an electronic-transformer power supply if half-cycles of approximately zero voltage of a signal envelope are absent in the monitored output voltage.

2. The system of claim 1, wherein the circuit removes negative half or positive half of the output voltage to create the modified output voltage.

3. The system of claim 1, wherein the circuit comprises a diode.

4. The system of claim 3, wherein the diode is a discrete component or disposed in a clamping circuit in an input of a microprocessor.

5. The system of claim 3, wherein the diode is a Zener diode.

6. The system of claim 3, wherein the circuit further comprises a device for limiting current flowing through the diode.

7. The system of claim 6, wherein the device comprises a resistor or transistor.

8. The system of claim 3, wherein the diode and the current-limiting device are connected in series and connect to at least one output port of the power supply.

9. The system of claim 1, wherein the analyzer comprises digital logic for sampling the output voltage and analyzing the samples to determine the presence of half-cycles of approximately zero voltage of the signal or the signal envelope.

10. The system of claim 1, wherein the analyzer comprises analog logic for determining an average or maximum voltage of the output voltage and for determining that half-cycles of approximately zero voltage of the signal or the signal envelope are present if the average or maximum voltage is lower than a threshold.

11. The system of claim 1, further comprising a controller for controlling at least one system behavior, such as a current waveform, power consumption, dimmer response curve, or minimum current draw, based on the type of the AC power supply.

12. The system of claim 1, wherein the half-cycles of approximately zero voltage of a signal or a signal envelope comprise ±10% or ±5% of the maximum output voltage of the AC power supply.

13. A method for detecting whether a transformer used in an AC power supply is magnetic or electronic, the method comprising:

modifying an output voltage of the AC power supply, monitoring a negative half or a positive half of the modified output voltage of the power supply;

determining whether half-cycles of substantially zero voltage of a signal or a signal envelope are present in either the negative half or the positive half of the monitored output voltage; and determining that the AC power supply comprises a magnetic-transformer power supply if half-cycles of substantially zero voltage of a signal are present in the monitored output voltage or determining that the AC power supply type comprises an electronic-transformer power supply if half-cycles of substantially zero voltage of a signal envelope are absent in the monitored output voltage.

14. The method of claim 13, wherein modifying the output voltage comprises removing a negative half from the output voltage.

15. The method of claim 13, wherein modifying the output voltage comprises removing a positive half from the output voltage.

16. The method of claim 13, wherein the presence half-cycles of approximately zero voltage of the signal or the signal envelope is determined based at least in part on a plurality of sampling voltages at a sampling frequency.

17. The method of claim 16, wherein the sampling frequency is approximately equal to frequency of an electronic transformer.

18. The method of claim 16, wherein the sampling frequency is approximately 60 Hz, 120 Hz, or 180 Hz.

19. The method of claim 13, wherein the presence half-cycles of approximately zero voltage of the signal or the signal envelope is determined based at least in part on an RMS voltage or maximum voltage of the modified output voltage.

20. The method of claim 13, wherein the half-cycles of approximately zero voltage of a signal or a signal envelope comprise ±10% or ±5% of the maximum output voltage of the AC power supply.

* * * * *

UNITED STATES PATENT AND TRADEMARK OFFICE

CERTIFICATE OF CORRECTION

PATENT NO. : 8,698,483 B2
APPLICATION NO. : 13/292690
DATED : April 15, 2014
INVENTOR(S) : Scott A. Riesebosch It is certified that error appears in the above-identified patent and that said Letters Patent is hereby corrected as shown below:

On the title page of the patent, Assignee request that the correct name of the Assignee be printed on the title page of the patent as follows:

Name of Assignee: CRS, Electronics, Inc., Welland, Ontario (CA)

Signed and Sealed this
First Day of September, 2015

Michelle K. Lee

Michelle K. Lee
*Director of the United States Patent and Trademark Office*